United States Patent
Walz et al.

(10) Patent No.: US 7,408,775 B2
(45) Date of Patent: Aug. 5, 2008

(54) ELECTRICAL MODULE AND SUPPORT THEREFOR WITH INTEGRATED COOLING

(75) Inventors: Andrew A. Walz, Toronto (CA); Donald A. Tegart, Mississauga (CA)

(73) Assignee: Honeywell International Inc., Morristown, NJ (US)

( * ) Notice: Subject to any disclaimer, the term of this patent is extended or adjusted under 35 U.S.C. 154(b) by 291 days.

(21) Appl. No.: 10/968,745

(22) Filed: Oct. 19, 2004

(65) Prior Publication Data

US 2006/0082970 A1    Apr. 20, 2006

(51) Int. Cl.
*H05K 7/20* (2006.01)

(52) U.S. Cl. .............. 361/699; 361/689; 174/15.1; 165/104.33; 165/80.4

(58) Field of Classification Search .......... None
See application file for complete search history.

(56) References Cited

U.S. PATENT DOCUMENTS

| | | | | |
|---|---|---|---|---|
| 4,375,290 A | * | 3/1983 | Zucchi et al. | 277/608 |
| 4,836,789 A | | 6/1989 | Rudy, Jr. et al. | |
| 4,962,444 A | | 10/1990 | Niggemann | |
| 5,057,968 A | * | 10/1991 | Morrison | 361/700 |
| 5,131,859 A | * | 7/1992 | Bowen et al. | 439/194 |
| 5,424,916 A | * | 6/1995 | Martin | 361/698 |
| 5,471,850 A | * | 12/1995 | Cowans | 62/223 |
| 5,740,018 A | | 4/1998 | Rumbut, Jr. | |
| 5,781,042 A | | 7/1998 | Jung | |
| 5,923,533 A | * | 7/1999 | Olson | 361/699 |
| 6,525,937 B2 | * | 2/2003 | Yanagida | 361/695 |
| 6,535,382 B2 | * | 3/2003 | Bishop et al. | 361/690 |
| 6,536,510 B2 | * | 3/2003 | Khrustalev et al. | 165/104.33 |
| 6,643,123 B2 | * | 11/2003 | Hartel et al. | 361/678 |
| 6,643,132 B2 | | 11/2003 | Faneuf et al. | |
| 6,644,058 B2 | * | 11/2003 | Bash et al. | 62/259.2 |
| 6,661,664 B2 | | 12/2003 | Sarno et al. | |
| 6,714,412 B1 | * | 3/2004 | Chu et al. | 361/699 |
| 6,807,056 B2 | * | 10/2004 | Kondo et al. | 361/689 |
| 6,958,911 B2 | * | 10/2005 | Cader et al. | 361/699 |
| 7,012,807 B2 | * | 3/2006 | Chu et al. | 361/699 |

(Continued)

FOREIGN PATENT DOCUMENTS

JP   2002374086 A   * 12/2002

*Primary Examiner*—Boris L Chervinsky
(74) *Attorney, Agent, or Firm*—Oral Caglar, Esq.

(57) ABSTRACT

A rack system is disclosed that includes a plurality of electrical modules (48), a frame (10) supporting the plurality of electrical modules (48) that includes a plurality of frame members (16, 18, 20, 22, 26, 38, 39, 40) and a plurality of locations (52) for supportably receiving one of the plurality of electrical modules (48), a first frame member (16) of the plurality of frame members including a first bore (68) for transporting a liquid along a length of the first frame member (16) and having a plurality of openings extending through the first frame member (16) between a sidewall of the bore (68) and an exterior surface of the frame member (68), and a plurality of first connectors (64) mounted in the plurality of openings, wherein one of the plurality of electrical modules (48) includes a cooling liquid pathway (84) and at least one second connector (86) providing access to the cooling liquid pathway (84) detachably engaging the first connector (64) to provide fluid communication between the first bore (68) and the cooling liquid pathway (84) when the one of the plurality of electrical modules (48) is mounted at one of the plurality of locations (52).

32 Claims, 6 Drawing Sheets

U.S. PATENT DOCUMENTS

| | | |
|---|---|---|
| 7,187,549 B2 * | 3/2007 | Teneketges et al. ......... 361/699 |
| 2003/0156060 A1 | 8/2003 | Revankar et al. |
| 2004/0221604 A1 * | 11/2004 | Ota et al. .................. 62/259.2 |

* cited by examiner

ELECTRICAL MODULE AND SUPPORT THEREFOR WITH INTEGRATED COOLING

FIELD OF THE INVENTION

The present invention is directed toward an electrical module having an internal cooling liquid passage, a support therefor that includes an integral cooling system, and an assembly of the module and the support, and, more specifically, toward an electrical module, a support such as a rack or cabinet having a cooling liquid manifold formed in a structural element thereof in fluid communication with a cooling passage in the module, and an assembly of the module and the support.

BACKGROUND OF THE INVENTION

Electrical modules, which may comprise line replaceable modules (LRM's), may include internal cooling passages for carrying a cooling liquid, such as water, through the module. In use, these modules are connected to sources of cooling liquid and to power sources using a variety of hoses or pipes and wires.

Modules are sometimes mounted in a cabinet or on a rack with other LRM's. This arrangement is space-efficient, but concentrates many heat sources in a small, often enclosed, area, making it important that each module receives an adequate supply of cooling liquid. Mounting the modules in close proximity to each other, however, makes it difficult to connect and disconnect each module to a source of cooling liquid and/or power. It is therefore desirable to provide improved electrical modules and supports that allow for easy interconnection as well as systems of such modules and supports.

SUMMARY OF THE INVENTION

These difficulties and others are addressed by the present invention which comprises, in a first aspect, an electrical cabinet having a plurality of support members, one of which comprises a first cooling liquid manifold. A plurality of connectors is provided on the support member which selectively provide access to the cooling liquid manifold.

Another aspect of the invention comprises a rack for supporting a plurality of electrical modules which rack includes a frame having a plurality of frame members defining a plurality of locations for supportably receiving an electrical module. A first one of the frame members comprises a first manifold, and a plurality of first connectors are provided on the first frame member for selectively providing access to the first manifold.

A further aspect of the invention comprises a rack system that includes a plurality of electrical modules, at least one of which has a cooling liquid pathway and a connector for providing access to the cooling liquid pathway. The rack system also includes a frame supporting the plurality of electrical modules and has a plurality of frame members and a plurality of locations supportably receiving one of the plurality of electrical modules. At least one of the frame members comprises a first manifold, and a plurality of second connectors are provided on that support member to selectively provide access to the first manifold. The first connector is detachably connected to the second connector to provide fluid communication between the first manifold and the cooling liquid pathway when one of the plurality of electrical modules is mounted at one of the plurality of locations.

Another aspect of the invention comprises a rack-mountable electrical module having a housing having an internal cooling liquid conduit. A first cooling liquid connector on the module selectively provides access to the cooling liquid conduit when pressed against a second cooling liquid connector. A first electrical connector forms an electric connection with a source of electricity when the first cooling liquid connector is pressed against the second cooling liquid connector.

An additional aspect of the invention comprises a rack system that includes a plurality of electrical modules and a frame supporting the plurality of electrical modules. The frame has a plurality of frame members defining a plurality of locations for supportably receiving one of the plurality of electrical modules. A first frame member includes a first bore for transporting a liquid along a length of the first frame member and a plurality of openings extending through the first frame member between a sidewall of the bore and an exterior surface of the frame member. A plurality of first connectors are mounted in the plurality of openings. One of the plurality of electrical modules comprises a cooling liquid pathway and at least one second connector providing access to the cooling liquid pathway that is detachably connectable to the first connector to provide fluid communication between the first bore and the cooling liquid pathway when the module is mounted at one of the plurality of locations.

A further aspect of the invention comprises a method of supplying a cooling liquid to an internal cooling liquid passageway of a rack-mountable electrical module that involves providing a rack comprising a support member having a longitudinal bore and a plurality of first connectors selectably providing access to the bore. A second connector on the rack mountable electrical module is aligned with a first one of the plurality of first connectors on the support member and the module is slid relative to the support member until the second connector engages the first connector.

An additional aspect of the invention comprises an electrical cabinet that includes a frame arrangement including a plurality of supports for supporting a plurality of electrical modules and a heat dissipation arrangement incorporated in at least one of the plurality of supports for carrying a cooling fluid to electrical modules mounted in the frame arrangement.

BRIEF DESCRIPTION OF THE DRAWINGS

These aspects of the invention and others will be better understood upon a reading of the following detailed description of an embodiment of the invention in connection with the drawings, wherein.

DETAILED DESCRIPTION

Figure 1:
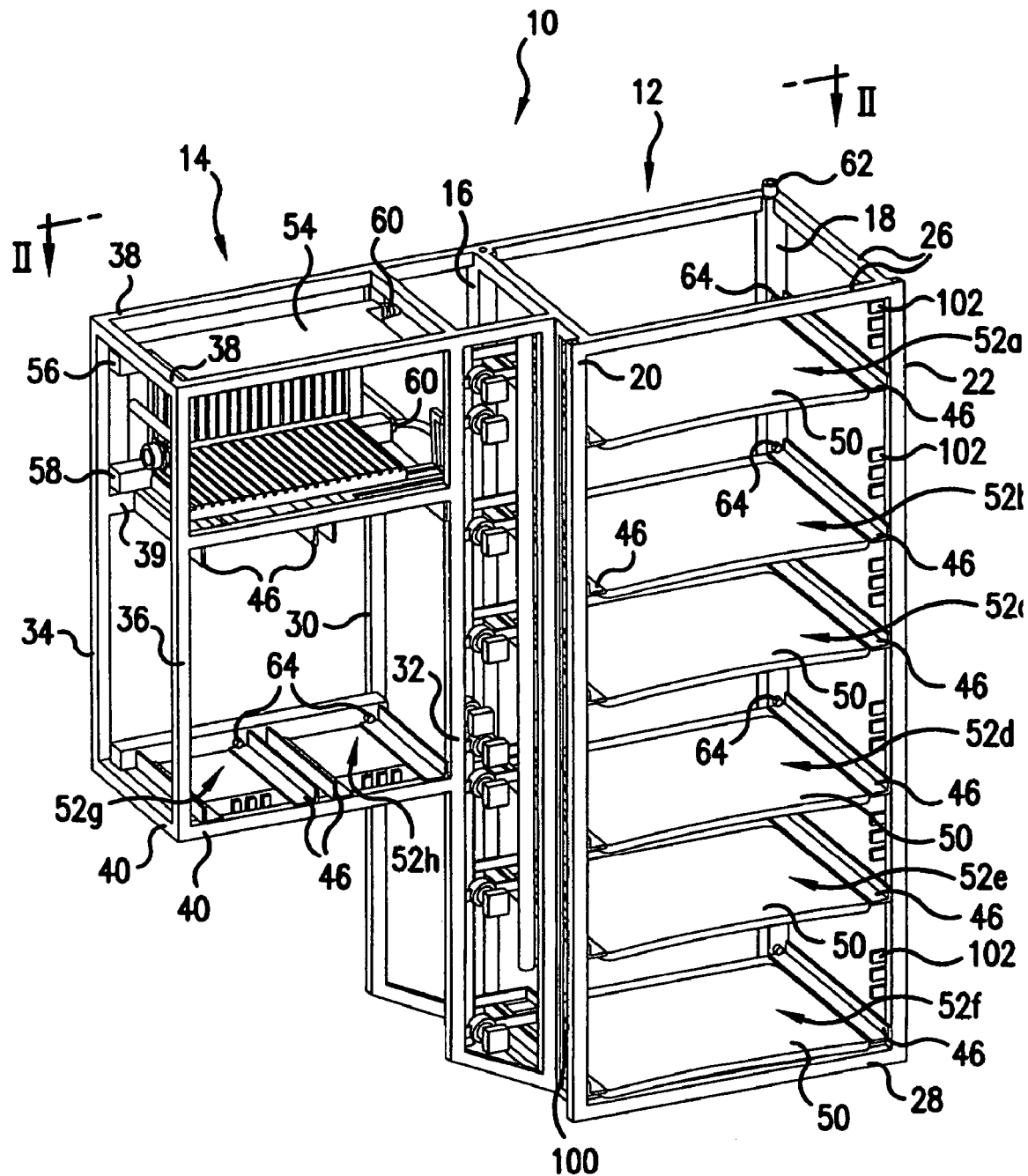
FIG. 1 is a perspective view of a support rack according to an embodiment of the present invention.

Referring now to the drawings, wherein the showings are for purposes of illustrating a preferred embodiment of the invention only, and not for the purpose of limiting same, FIG.

1 illustrates a rack or frame 10 comprising a primary rack 12 and a secondary rack 14 joined to primary rack 12. Primary rack 12 is comprised of a plurality of frame members or support members including four vertical support members or legs, namely, a left rear leg 16, a right rear leg 18, a left front leg 20 and a right front leg 22 ("left," "right," "front" and "rear" being used with respect to the orientation of rack 10 in FIG. 1). The legs are interconnected by upper horizontal braces 26 and lower horizontal braces 28, sometimes referred to herein as cross members. Legs 16, 18, 20, and 22, and many other elements of rack 10 may be made from extruded aluminum, which provides rigidity for the rack 10.

Secondary rack 14 includes a right rear leg 30 generally parallel to left rear leg 16 of primary rack 12 and a right front leg 32 approximately the same length as secondary rack right rear leg 30. Secondary rack 14 further includes a left rear leg 34 and a left front leg 36 both of which are substantially shorter than the secondary rack right legs 30, 32. The secondary rack legs are joined by upper horizontal supports 38 and lower horizontal supports 40 and middle horizontal supports 39.

Figure 4:
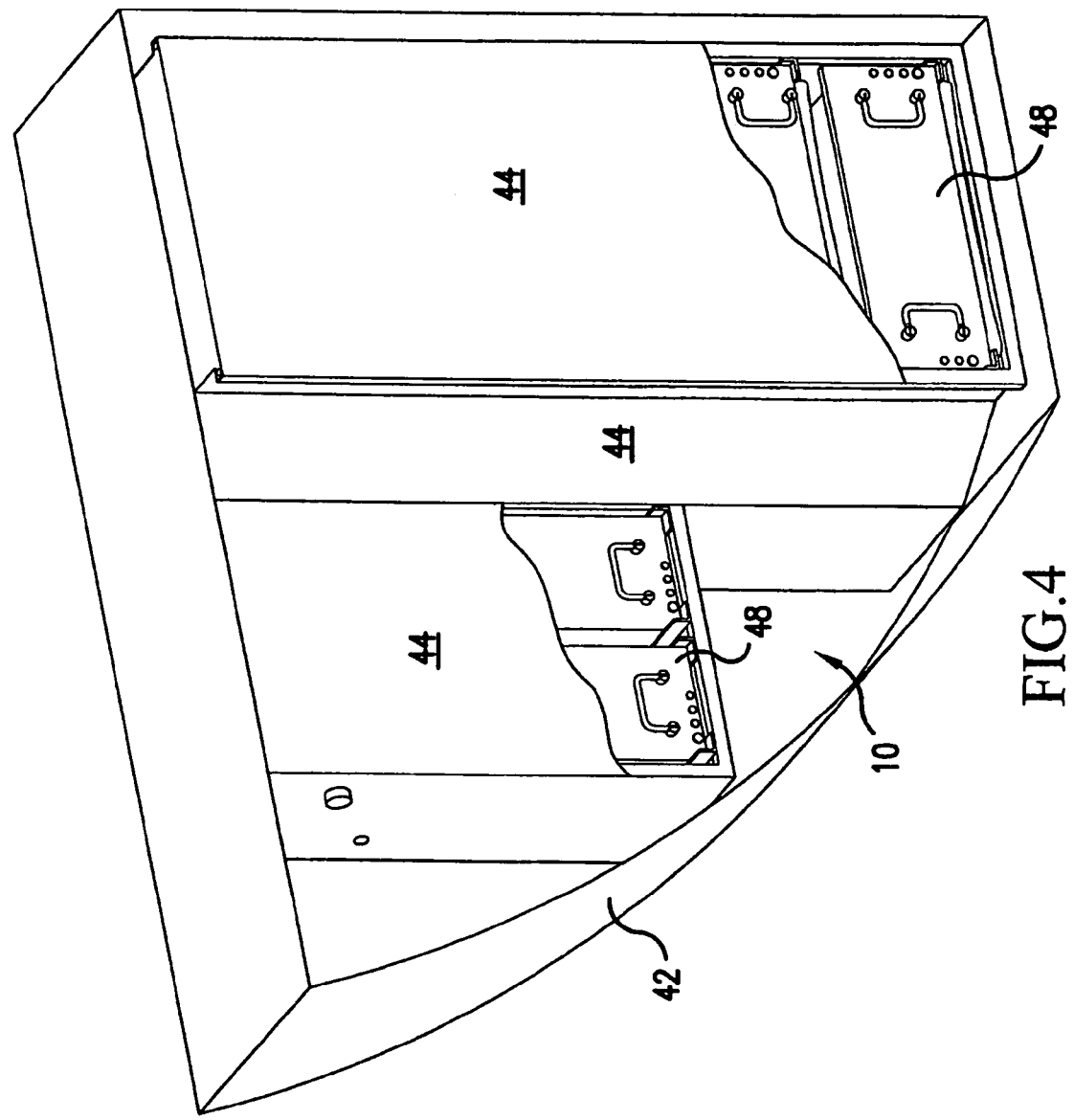
FIG. 4 is a perspective view of an electrical cabinet including the support rack of FIG. 1.

FIG. 4 illustrates the mounting of rack 10 in a rounded fuselage 42 of an aircraft, the racks being mounted behind panels 44, which may be honeycombed panels, to form cabinets enclosing the rack 10. The rack legs, including legs 16, 18, form the main structural backbone of the cabinet and also provide primary mounting hardpoints for securing rack 10 to the fuselage or other structure. Racks used in different environments may have different configurations from rack 10 without exceeding the scope of the present invention.

Figure 3:
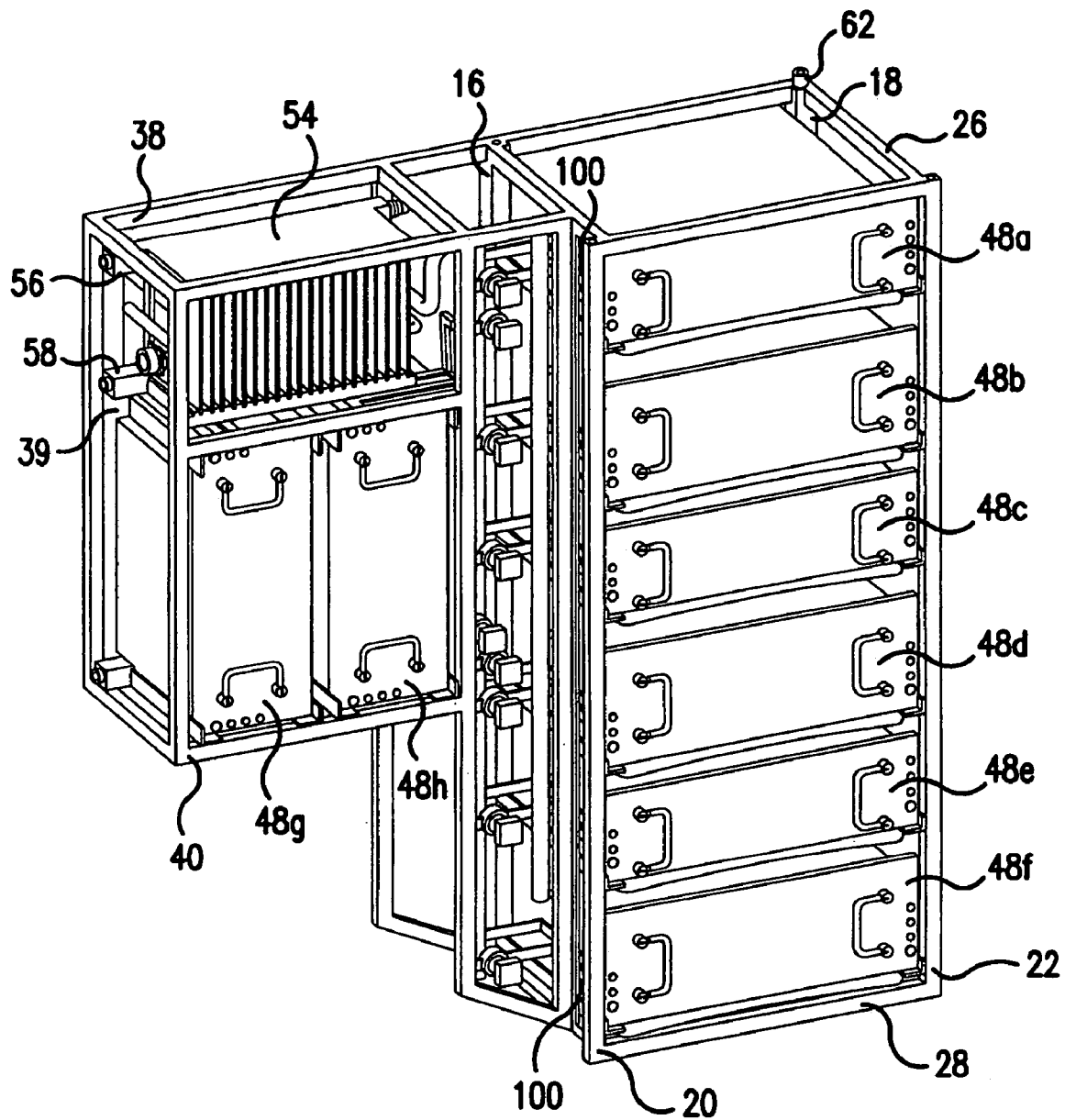
FIG. 3 is a perspective view of the support rack of FIG. 1 with a plurality of electrical modules mounted thereon.

Primary rack 12 includes a plurality of angle brackets 46 that extend between the left rear leg 16 and the left front leg 20 and between the right rear leg 18 and the right front leg 22. Pairs of these angle brackets 46 define slideways for supporting generally rectangular electrical modules 48 illustrated, for example, in FIG. 3 and FIG. 5, and support panels 50 which help define locations 52a-52f for receiving electrical modules 48 in the rack 10. Secondary rack 14 also includes angle brackets 46 for slidably receiving electrical modules 48 in two additional locations 52g and 52h. More of fewer locations can be provided, depending on the number of modules required and the space available for mounting rack 10. The angle brackets 46 of primary rack 12 are arranged to define locations 52a-52f for receiving modules 48 in a generally horizontal orientation—that is, with the long dimension of the rectangular module normal to the primary rack legs 16, 18, 20, 22. The angle brackets 46 of secondary rack 14 are arranged to receive the modules 48 in a generally vertical orientation, that is, with the long dimension of the modules 48 generally parallel to secondary rack legs 30, 32, 34, 36.

A control card cage 54 is also provided in secondary rack 14 which is a central location for storing control cards for the modules 48. Providing a central location for control cards allows for ready access, ease of maintenance and simplified shielding. The card cage 54 may be subdivided to allow for an internal firewall if needed and separate motherboards as required. The card cage 54 is liquid cooled and includes an upper manifold 56 and a lower manifold 58 each of which provides cooling liquid to separate cooling circuits (not shown) in the card cage 54 and each of which includes a connector 60 for connection to a source of cooling liquid, such as water or a propylene glycol and water mixture, as described herein.

Elements, such as rear legs 16, 18 of primary rack 12 are required to support modules 48, and the present inventors have found a way to use these structural elements as fluid flow conduits. This reduces the need for connecting pipes and tubes to the various modules in the rack. Horizontal supports such as secondary rack middle support 39 and secondary rack lower support 40 are also structural, although they may or may not be load bearing, and may also include internal bores for carrying cooling liquid. The location of the modules is not fixed and it may be possible to move a module from one location to another without substantially changing the operation of the system. However, for ease of reference herein, any module mounted at a particular location will be referred to with the numeral 48 and the same letter suffix as the location, for example the module located at location 52a will be referred to as module 48a.

In the present embodiment, rear legs 16, 18 of primary rack 12 include internal bores defining conduits for carrying cooling fluid in one or more independent fluid flow paths. The number and arrangement of the flow paths and the number of connections to sources of cooling fluid can be changed without exceeding the scope of this invention. A plurality of connectors selectively provide access to the conduits including a main connector 62 for connecting primary rack 12 to a source of cooling liquid and a plurality of module connectors 64 located in pairs on rear legs 16, 18 in each location 52. The connectors 62, 64 are preferably quick disconnect dry break couplings. Suitable connectors are available from several sources, including the Aeroquip group of Eaton Corporation, located in Maumee, Ohio, as part numbers 70575g and 71887g.

Figure 2:
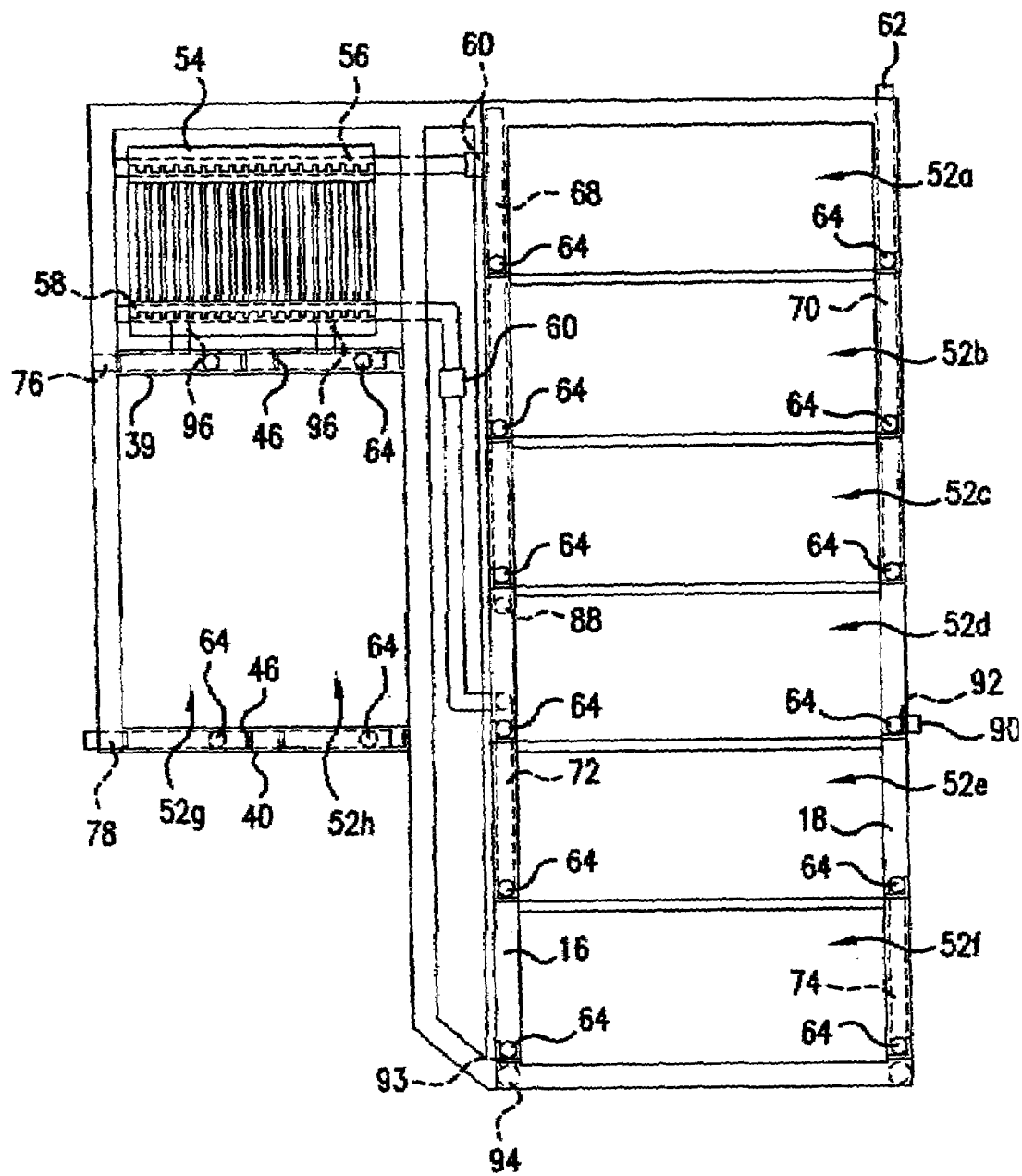
FIG. 2 is a sectional front elevational view taken in the direction of arrows II-II in FIG. 1.
Figure 7:
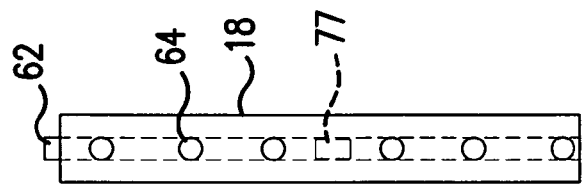
FIG. 7 is an elevational view of a vertical support member for the primary rack that includes a bore and a plug dividing the bore into first and second portions.

With reference to FIG. 2, a first flow path, which provides cooling liquid to modules mounted in the upper three locations 52a, 52b and 52c of primary rack 12 includes a first conduit 68 in left rear leg 16 and a second conduit 70 in right rear leg 18. A second flow path, for providing cooling liquid to modules 48 mounted on the lower three locations 52d, 52e and 52f of rack 12 includes a third conduit 72 in left rear leg 16 and a fourth conduit 74 located in right rear leg 18. A third flow path, for cooling modules mounted in secondary rack 14 includes a fifth conduit 76 in middle horizontal support 39 and a sixth conduit 78 in lower horizontal support 40. These flow paths may be formed in various manners. One suitable method for forming the different flow paths is to provide extruded aluminum legs 16 18, for example, having bores extending completely through the length thereof and then welding, swaging, or otherwise securing one or more plugs 77 illustrated in FIG. 7 in the bores to divide them into separate flow paths. Fluid flow through these flow paths will be described below after a description of modules 48.

Figure 5:
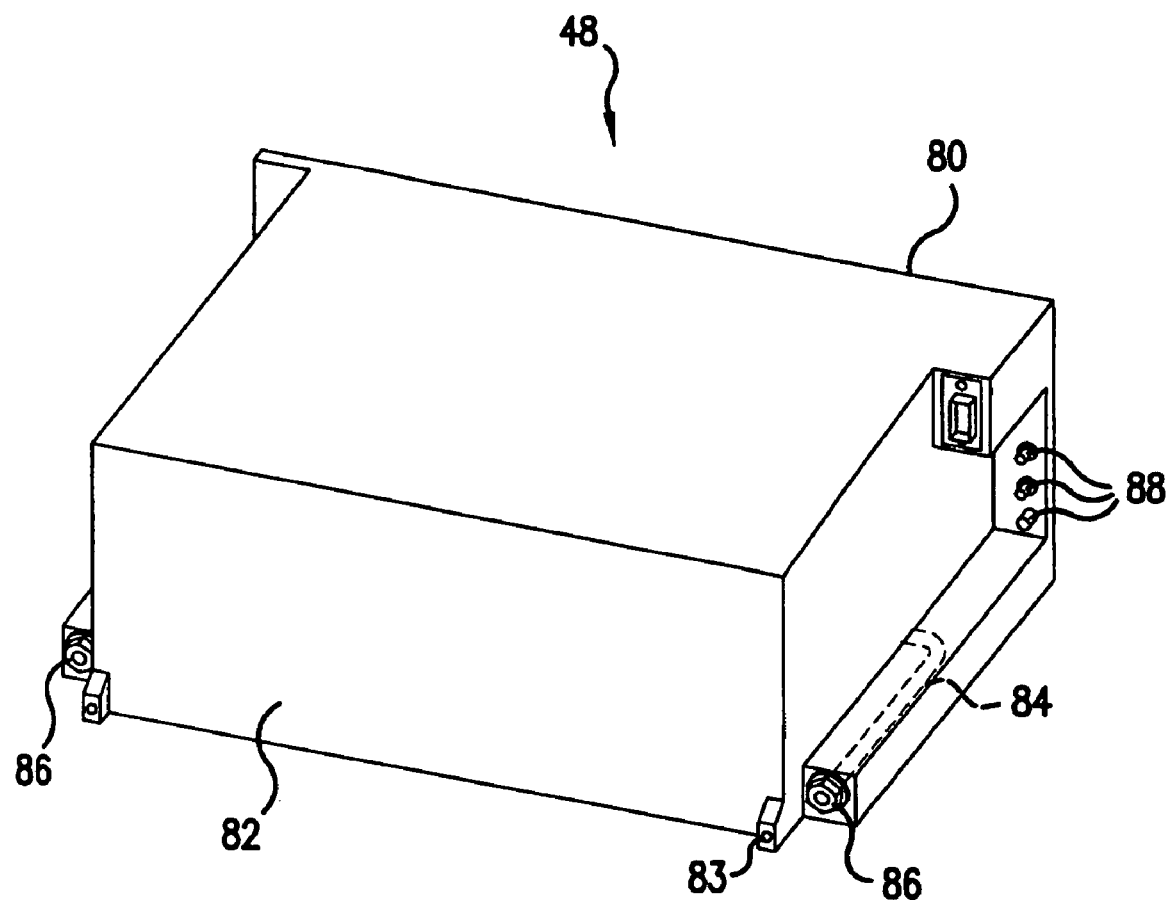
FIG. 5 is a rear perspective view of one of the electrical modules of FIG. 3.
Figure 6:
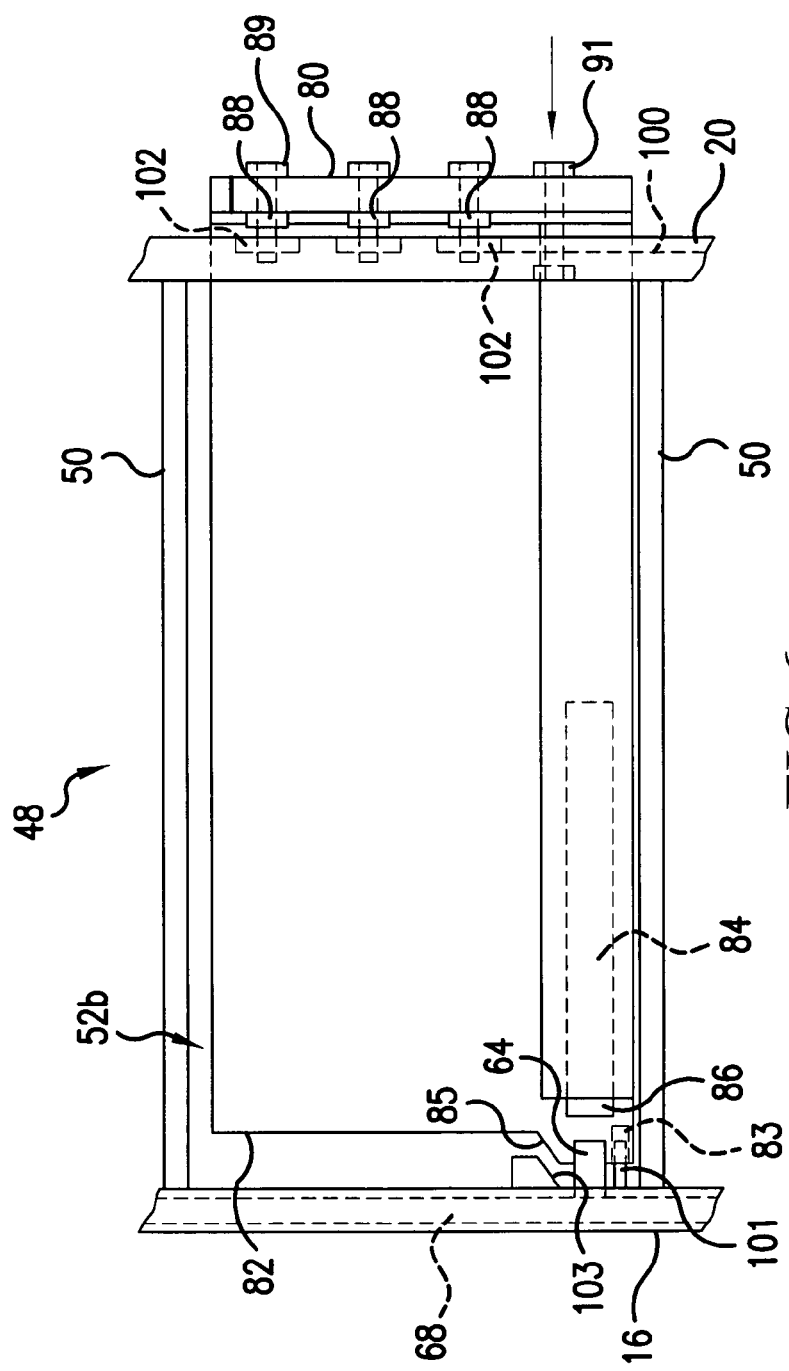
FIG. 6 is a side elevational view of the module of FIG. 5 in the process of being mounted on the rack of FIG. 1.

Referring again to FIGS. 2 and 3, a plurality of modules 48 are illustrated mounted in primary rack 12 and secondary rack 14 in FIG. 3. As illustrated in FIGS. 5 and 6, each module 48 includes a front 80, a rear 82 including a guide pin hole 83 and an angled wall portion 85, an internal cooling liquid flow path 84 and two connectors 86 of a first type providing access to the cooling liquid flow path 84 and allowing for connection to complementary connectors of a second type, such as module connectors 64 on legs 16 and 18. The modules further include a plurality of electrical connectors 88 near module front 80 that include captive bolts 89 for holding connectors 88 against an electrical bus described hereafter. A connecting bolt 91, illustrated in FIG. 6, holds module 48 securely to rack 10 and holds connectors 86 firmly against connectors 64. The modules, or LRM's, may be of a variety of types including, for example, high power, high heat dissipation electrical devices such as motor controllers, inverters or related devices.

As will be appreciated from FIG. 6, the fluid connectors 86 on the modules 48 connect to the connectors 64 on the rear legs 16, 18 when a module 48 is slidingly inserted into a location 52 on rack 10 and the connectors 86 on the module are pressed against the connectors 64 on the legs. A guide pin 101 on rear leg 16 is received in guide pin hole 83 to help align the module with the connectors in the rack. Moreover, rear leg 16 includes an angled surface 103 that is engaged by angled wall 85 on module 48 as module 48 is moved toward the rear of rack 10 to help hold the rear portion of module 48 in place.

When modules 48 are mounted in rack 10, the internal module cooling liquid flow path 84 of each modules forms part of the first, second and third flow paths mentioned above. For example, when module 48 is mounted in location 52a the internal cooling flow path 84 connects first conduit 68 to second conduit 70. Modules 48b and 48c likewise connect first conduit 68 to second conduit 70 at two additional locations to form three parallel connections between first conduit 68 and second conduit 70. Fluid flows into main connector 62 and into second conduit 70, splits into three flows through each of the modules 48a, 48b, 48c, flows into first conduit 68 and exits the flow path through exit 88. This first cooling flow path could include a greater or lesser number of modules if desired and is not limited to the three modules shown.

A second cooling flow path cools modules 48d, 48e and 48f mounted at the lower three locations 52d, 52e, 52f of primary rack 12. This second path provides a series connection between the modules and the conduits. Specifically, cooling liquid enters the second cooling flow path through a connector 90 and passes through a short conduit 92 to a connector 64 and into module 48d, through the internal cooling path 84 of module 48d and into third conduit 72. Module 48e is connected to third conduit 72 and receives cooling liquid therefrom which cooling liquid exits module 48e into fourth conduit 74. Module 48f is connected to fourth conduit 74, and cooling liquid passes through the internal cooling path of module 48f to a short conduit 93 which ends at exit connector 94. Such series cooling may sometimes be desirable, especially when the modules being cooled differ significantly in the heat outputs.

Modules 48g and 48h are connected between fifth conduit 76 and sixth conduit 78 in a similar manner. Fifth conduit 76 is connected to lower manifold 58 of the card cage by connectors 96. Connectors 60 connect upper manifold 56 of control card cage 54 to first conduit 68 and lower manifold 58 of card cage 54 to fifth conduit 76 as illustrated in FIG. 2. This connection to two separate sources of cooling fluid provides a higher lever of cooling and also redundant cooling for the temperature-sensitive control cards.

Rack 10 further includes a modular electrical bus 100 illustrated in FIG. 1 for carrying power and/or control signals to modules 48 which bus 100 includes electrical connectors 102. Bus 100 can be removed from rack 10 for repair or replacement. Referring to FIG. 6, it will be appreciated that electrical connectors 88 on modules 48 engage to bus connectors 102 when the module slides into one of the locations 52 and are secured thereto by captive bolts 89. This allows for electrical and fluid connections to be made as a single step in the installation process. Separating the electrical connectors 102 from the fluid connectors 86 reduces the likelihood of contact between water and the electrical connectors in the event that a connector leaks. Moreover, the electrical connectors are maintained in an accessible location at the front of rack 10 where they can readily be reached for repair or service.

By integrating cooling manifolds into the structural elements of a rack or cabinet, the number of parts and potential failure points are reduced, and the ease of use is increased. Structural strength is concentrated into rigid members that carry both internal and structural loads, and the wide mounting areas reduce the load bearing requirements on other supports in the environment—aircraft structural elements, for example. The legs, such as rear legs 16 and 18 provide strength for supporting the electrical modules and also attachment points for securing rack 10 to, e.g., an aircraft frame.

The present invention has been described in terms of several embodiments. Obvious modifications and additions will become apparent to those skilled in the relevant arts upon a reading of the foregoing disclosure and such modifications and additions are intended to comprise a part of the present invention to the extent they fall within the scope of the several claims appended hereto.

We claim:

1. An electrical cabinet comprising:
   a frame having a plurality of locations thereon one above the other each for supportably receiving one of a plurality of electrical modules, said frame also having a plurality of support members, a first one of said support members comprising a first cooling liquid manifold, another one of said support members being spaced from said first one of said support members by said locations on said frame extending therebetween;
   a plurality of first openings in said first one of said support members into said first cooling liquid manifold and a quick disconnect connector in each of said openings selectively providing access to said first cooling liquid manifold; and
   an electrical bus supported by said another one of said support members such that said electrical bus is separated from said quick disconnect connectors by said locations on said frame extending therebetween.

2. The electrical cabinet of claim 1 wherein said first cooling liquid manifold is defined by said first one of said support members.

3. The electrical cabinet of claim 1 wherein a second one of said support members defines a second fluid flow path.

4. The electrical cabinet of claim 3 wherein a third one of said support members comprises a holder for the electrical module.

5. The electrical cabinet of claim 1 wherein said plurality of support members comprises a rack-type support system.

6. The electrical cabinet of claim 4 wherein said third one of said support members comprises a second manifold.

7. The electrical cabinet of claim 1 wherein said plurality of support members comprises a plurality of legs and a plurality of cross members connected to said plurality of legs, wherein said first one of said support members comprises one of said plurality of legs.

8. The electrical cabinet of claim 1 wherein said plurality of support members comprise a plurality of legs and a plurality of cross members connected to said plurality of legs, wherein said first one of said support members comprises one of said plurality of cross members.

9. The electrical cabinet of claim 1 wherein said first one of said plurality of support members comprises an extruded aluminum member.

10. The electrical cabinet of claim 1 wherein said plurality of quick disconnect connectors comprises non-locking, dry-break connectors.

11. A rack for supporting a plurality of electrical modules comprising:
    a frame having a plurality of frame members and a plurality of locations for supportably receiving an electrical module, a first one of said frame members comprises a first support member comprising a first conduit;
    a plurality of openings through said first one of said frame members into said first conduit and a dry break connector in each of said plurality of openings through said first frame member selectively providing access to said first conduit;

wherein said first conduit comprises part of a first fluid flow path and wherein said first support member comprises a second conduit comprising a part of a second fluid flow path separate from said first fluid flow path.

12. The rack of claim 11 wherein said first conduit is defined by said first support member.

13. The rack of claim 11 including a second support member defining a second fluid flow path.

14. A rack system comprising:
a plurality of electrical modules, at least one of the plurality of electrical modules comprises a cooling liquid pathway and having a first connector for providing access to said cooling liquid pathway;
a frame supporting said plurality of electrical modules and having a plurality of frame members and a plurality of locations supportably receiving one of the plurality of electrical modules, at least one of said frame members comprising a first manifold;
an electrical bus supported by said frame; and
a plurality of second connectors mounted in openings in said at least one frame member selectively providing access to said first manifold;
wherein said first connector is detachably connected to one of said second connectors to provide fluid communication between said first manifold and said cooling liquid pathway when one of the plurality of electrical modules is mounted at one of the plurality of locations;
wherein said first manifold comprises a portion of a first fluid flow pathway and wherein at least one of said frame members comprises a second manifold comprising a portion of a second fluid flow pathway separate from said first fluid flow pathway.

15. The rack system of claim 14 including another first connector on the at least one of the plurality of modules connected to a second one of said plurality of second connectors on said at least one frame member.

16. The rack system of claim 15 wherein said electrical modules comprise line replaceable modules.

17. The rack system of claim 14 wherein said at least one electrical module includes an internal cooling liquid pathway connecting said first manifold to said second manifold.

18. The rack system of claim 14 wherein said plurality of frame members include a plurality of support members.

19. The rack system of claim 18 wherein the first manifold is formed in one of the support members.

20. The rack system of claim 14 wherein said at least one of frame members defines the first manifold.

21. The rack system of claim 14 wherein said first manifold comprises a bore in said at least one of the frame members.

22. The rack system of claim 14 wherein said first connectors and said second connectors comprise quick disconnect dry break connectors.

23. A rack system, comprising:
a plurality of electrical modules, at least several of the plurality of electrical modules each comprises a housing having an internal cooling liquid pathway and a first connector on one of spaced apart front and rear portions of said housing separated by said pathway so as to provide access to said pathway;
a frame having a plurality of locations thereon disposed one above another, said one of said plurality of electrical modules supportably received at one of said plurality of locations such that said electrical modules are disposed one above another at said locations on said frame, said frame also having first and second frame members spaced from one another by said plurality of module receiving locations extending therebetween, at least a portion of said first frame member comprising a manifold for containing cooling liquid;
an electrical bus supported by said second frame member; and
a plurality of second connectors mounted in openings in said portion of said first frame member selectively providing access to said manifold;
wherein said first connector is connected to said second connector to provide fluid communication between said cooling liquid pathway and said manifold when said one of the plurality of electrical modules is received at said one of the plurality of locations on said frame;
wherein said one of the plurality of electrical modules also comprises an electrical connector on the other of said front and rear portions of said housing, said electrical connector being connected to said bus when said one of the plurality of electrical modules is received at said one of the plurality of locations on said frame.

24. The rack system of claim 23 wherein said at least one electrical module is shiftable relative to said frame between a first position wherein said first connector engages one of said plurality of second connectors and wherein said electrical connector is electrically connected to said electrical bus and a second position wherein said first connector is spaced from one of said second connectors and wherein said electrical connector is electrically disconnected from said electrical bus.

25. The rack system of claim 23 including at least one panel mounted in said frame and defining one of said locations.

26. A rack-mountable electrical module comprising:
a housing having an internal cooling liquid conduit and front and rear portions spaced apart from one another with said conduit extending between said front and rear portions;
a first quick disconnect cooling liquid connector on one of said front and rear portions of said housing for selectively providing access to said cooling liquid conduit when pressed against a second quick disconnect cooling liquid connector; and
a first electrical connector on the other of said front and rear portions of said housing and being configured to form an electric connection with a source of electricity when said first cooling liquid connector is pressed against the second cooling liquid connector.

27. A rack system comprising:
a plurality of electrical modules including a module electrical connector;
a frame supporting said plurality of electrical modules and having a plurality of frame members and a plurality of locations each for supportably receiving one of the plurality of electrical modules;
an electrical bus supported by said frame and passing by a plurality of said locations;
a first frame member of the plurality of frame members including a first bore for transporting a liquid along a length of the first frame member and having a plurality of openings extending through the first frame member between a sidewall of the bore and an exterior surface of the frame member; and
a plurality of first connectors mounted in said plurality of openings;
wherein one of the plurality of electrical modules comprises a cooling liquid pathway and at least one second connector providing access to said cooling liquid pathway detachably engages said first connector to provide fluid communication between said first bore and said cooling liquid pathway and said module electrical connector engages said bus when the one of the plurality of electrical modules is mounted at one of the plurality of locations;

wherein said first bore in said first frame member includes an internal plug dividing said first bore into first and second fluid flow paths.

28. The rack system of claim 27 wherein said plurality of frame members include a plurality of support members and said first frame member comprises one of said plurality of support members.

29. The rack system of claim 28 wherein a second support member of the plurality of support members includes a second bore for transporting a liquid along a length of the second support member, said second bore being in fluid communication with said first bore.

30. The rack system of claim 28 wherein said first frame member includes a first angled wall portion, said plurality of electrical modules include a second angled wall portion, said first angled wall portion engaging said second angled wall portion to position said module in said rack.

31. The rack system of claim 28 wherein said first frame member includes a guide pin and said plurality of electrical modules include guide pin receiving openings.

32. An electrical cabinet comprising:
a plurality of support members, a first one of said support members comprising a first cooling liquid manifold; and
a plurality of first connectors on said first one of said support members selectively providing access to said first cooling liquid manifold;
wherein said first manifold comprises part of a first fluid flow path and wherein said first one of said support members comprises a second cooling liquid manifold comprising a part of a second fluid flow path separate from said first fluid flow path.

* * * * *